(12) United States Patent
Huang et al.

(10) Patent No.: US 11,355,443 B2
(45) Date of Patent: Jun. 7, 2022

(54) DIELETS ON FLEXIBLE AND STRETCHABLE PACKAGING FOR MICROELECTRONICS

(71) Applicant: Invensas Corporation, San Jose, CA (US)

(72) Inventors: Shaowu Huang, Sunnyvale, CA (US); Javier A. Delacruz, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 16/515,417

(22) Filed: Jul. 18, 2019

(65) Prior Publication Data

US 2019/0341350 A1    Nov. 7, 2019

Related U.S. Application Data

(63) Continuation of application No. 15/970,055, filed on May 3, 2018, now Pat. No. 10,403,577.

(51) Int. Cl.
*H01L 23/538* (2006.01)
*H01L 21/48* (2006.01)
(Continued)

(52) U.S. Cl.
CPC ...... *H01L 23/5387* (2013.01); *H01L 21/4846* (2013.01); *H01L 23/49894* (2013.01);
(Continued)

(58) Field of Classification Search
CPC ....... H01L 33/486; H01L 33/54; H01L 33/58; H01L 33/60; H01L 33/62; H01L 24/48;
(Continued)

(56) References Cited

U.S. PATENT DOCUMENTS

| 5,729,896 A | * | 3/1998 | Dalal | ............... H01L 24/16 29/840 |
| 6,500,694 B1 | | 12/2002 | Enquist | |

(Continued)

OTHER PUBLICATIONS

Khan et al., "Technologies for Printing Sensors and Electronics Over Large Flexible Substrates: A Review," IEEE Sensors Journal, vol. 15, No. 6, Jun. 2015, 22 pages.

*Primary Examiner* — Ermias T Woldegeorgis
(74) *Attorney, Agent, or Firm* — Lee & Hayes, P.C.

(57) ABSTRACT

Dielets on flexible and stretchable packaging for microelectronics are provided. Configurations of flexible, stretchable, and twistable microelectronic packages are achieved by rendering chip layouts, including processors and memories, in distributed collections of dielets implemented on flexible and/or stretchable media. High-density communication between the dielets is achieved with various direct-bonding or hybrid bonding techniques that achieve high conductor count and very fine pitch on flexible substrates. An example process uses high-density interconnects direct-bonded or hybrid bonded between standard interfaces of dielets to create a flexible microelectronics package. In another example, a process uses high-density interconnections direct-bonded between native interconnects of the dielets to create the flexible microelectronics packages, without the standard interfaces.

9 Claims, 9 Drawing Sheets

(51) Int. Cl.
    *H01L 23/498* (2006.01)
    *H01L 23/00* (2006.01)
    *H01L 25/065* (2006.01)

(52) U.S. Cl.
    CPC .......... *H01L 23/5386* (2013.01); *H01L 24/08* (2013.01); *H01L 24/24* (2013.01); *H01L 24/82* (2013.01); *H01L 25/0652* (2013.01); *H01L 25/0655* (2013.01); *H01L 2224/08225* (2013.01); *H01L 2224/24137* (2013.01); *H01L 2224/80895* (2013.01); *H01L 2224/80896* (2013.01); *H01L 2224/82896* (2013.01); *H01L 2224/82897* (2013.01)

(58) Field of Classification Search
    CPC . H01L 24/47; H01L 25/0652; H01L 25/0655; H01L 25/071; H01L 25/072; H01L 25/0753; H01L 25/115; H01L 21/4846; H01L 21/568; H01L 23/5387; H01L 23/49894; H01L 23/5386; H01L 23/3121; H01L 24/08; H01L 24/24; H01L 24/82; H01L 24/32; H01L 24/83; H01L 2224/08225; H01L 2224/24137; H01L 2224/80895; H01L 2224/80896; H01L 2224/82896; H01L 2224/82897; H01L 2224/32225; H01L 2224/83894; H01L 24/96; H01L 2924/3511
    See application file for complete search history.

(56) References Cited

U.S. PATENT DOCUMENTS

| | | | |
|---|---|---|---|
| 6,867,073 B1* | 3/2005 | Enquist | H01L 21/76898 257/E21.597 |
| 7,816,856 B2 | 10/2010 | Cok et al. | |
| 9,941,180 B2 | 4/2018 | Kim et al. | |
| 10,074,630 B2 | 9/2018 | Kelly et al. | |
| 2004/0157407 A1* | 8/2004 | Tong | H01L 24/09 438/455 |
| 2010/0213819 A1* | 8/2010 | Cok | H01L 27/3255 313/498 |

* cited by examiner

SIDE VIEW

TOP VIEW

SIDE VIEWS

SIDE VIEW

FRONT VIEW

SIDE VIEW

FRONT VIEW

EXAMPLE ACTUAL SIZES

DIELETS ON FLEXIBLE AND STRETCHABLE PACKAGING FOR MICROELECTRONICS

RELATED APPLICATIONS

This nonprovisional patent application claims the benefit of priority to U.S. patent application Ser. No. 15/970,055 to Huang et al., filed May 3, 2018 and incorporated herein by reference in its entirety.

BACKGROUND

Flexible and stretchable electronics packages provide computing power in certain environments where flexibility and good shock-resistance is needed. Various sports applications, medical devices, nano-sensors, micro-electromechanical systems, and networking modules for the Internet-of-Things can benefit from microelectronics on flexible substrates. For example, wrist wraparound devices can be made thinner, lighter, and less noticeable when the onboard microelectronics can flex with the changing environment. Shape-compliant and shock-resistant microelectronics can be included in many items, such as vibrating appliances, motor parts, clothing, wearable fitness sensors, bandages, flexible medical devices, heart catheters, bottles, drinking cans, footballs, balloons, and so forth, that are traditionally off-limits to conventional electronics on rigid substrates.

Dielets and small chiplets work well with flexible substrates to bring the processing power of large microprocessors characteristic of CPUs to flexible microelectronics packages. An array of dielets enables a microprocessor to be "broken-up" into subsystems, located on many individual dielet pieces flexibly connected together, each dielet performing a function or containing a subsystem of the conventionally monolithic microprocessor. Each dielet may have a specific or proprietary function from a library of functions, enabling a collection of dielets to emulate the large monolithic chip. A dielet or chiplet can be a complete subsystem IP core (intellectual property core) possessing a reusable unit of logic, on a single die. A library of such dielets is available to provide routine or well-established IP-block functions. The numerous dielets for emulating many functions of a large monolithic processor can also be made very thin, making a processor or CPU that is distributed in dielets to be more physically compliant, thinner, lighter weight, and more shock-resistant than conventional devices.

Computer memory, on the other hand, such as random access memory (RAM), cannot be made too thin without degrading memory performance in proportion. At physical slices thinner than 50 microns, a loss-of-memory disadvantage begins to outweigh the thinness advantage. Thus, it can be difficult to achieve large amounts of memory on thin, compliant microelectronics packages, because the memory chips need to remain relatively thick.

Nonetheless, both significant computer memory and microprocessing elements could theoretically be implemented on thin, flexible substrates as distributed collections of dielets if the interconnections between the dielets could be made dense enough to provide high-capacity communication between the dielets. But the dielets are small, and so high-density communication between dielets has conventionally proven to be a challenge.

SUMMARY

Dielets on flexible and stretchable packaging for microelectronics are provided. An example process uses high-density interconnects direct-bonded or hybrid bonded between standard interfaces of dielets to create a flexible microelectronics package. In another example, a process uses high-density interconnections direct-bonded or hybrid bonded between native interconnects of the dielets to create the flexible microelectronics packages, without the standard interfaces. A native interconnect of a dielet is defined herein as a core-side conductor of the dielet that conducts core-side signals of the dielet before the signal is modified by a standard interface of the dielet. Some dielets may not have a standard interface, so a native interconnect is the only way for such a dielet to port the native core-side signals.

High-density communication between the dielets is achieved with various direct-bonding techniques that achieve high conductor count and very fine pitch on flexible, stretchable, and/or twistable substrates. An example process uses high-density interconnects direct-bonded between standard interfaces of dielets to create a flexible microelectronics package. In another example, a process uses high-density interconnections direct-bonded between native interconnects of the dielets to create the flexible microelectronics packages, without the standard interfaces.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes dielets on flexible and stretchable packaging for microelectronics. Significant computing power is achieved on small flexible packages by implementing a collection of distributed dielets, interconnected by direct-bonding interconnect (DBI®) techniques with a relatively high count of fine-pitched conductive lines on the flexible or stretchable substrates. The high-density interconnections may be between standard input-output (I/O) interfaces of the dielets being interconnected, or in some cases may be between native core-level interconnects of the dielets being interconnected.

In an implementation, the high count of fine-pitched conductive lines between dielets is achieved by direct-bonding or hybrid bonding processes (both processes encompassed representatively herein by the term "direct-bonding"), which are able to connect dielets to lines or wires at a very fine pitch. For example, the hybrid bonding process may be a DBI® hybrid bonding technique, available from Invensas Bonding Technologies, Inc. (formerly Ziptronix, Inc.), a subsidiary of Xperi Corp. In an implementation, DBI® hybrid bonding of conductive lines between standard input-output (I/O) interfaces of the dielets is used to achieve high-density inter-dielet communications, while in another implementation, DBI® hybrid bonding of conductive lines between native interconnects of the dielets is used to achieve the high-density inter-dielet communications in the context of flexible packaging. The signal pitch within a given dielet may be in the 0.1-5.0 micron pitch range. Native conductors of a given dielet may be at an average pitch of approximately 3 microns in the dense areas, so the direct-bonding technology, such as DBI® hybrid bonding, is able to connect conductors together at these fine and ultrafine pitches. The dielets can be very small, however, with footprint dimensions of 0.25×0.25 microns and on up. So native conductors of the dielets are proportionately fine-pitched.

Figure 1:
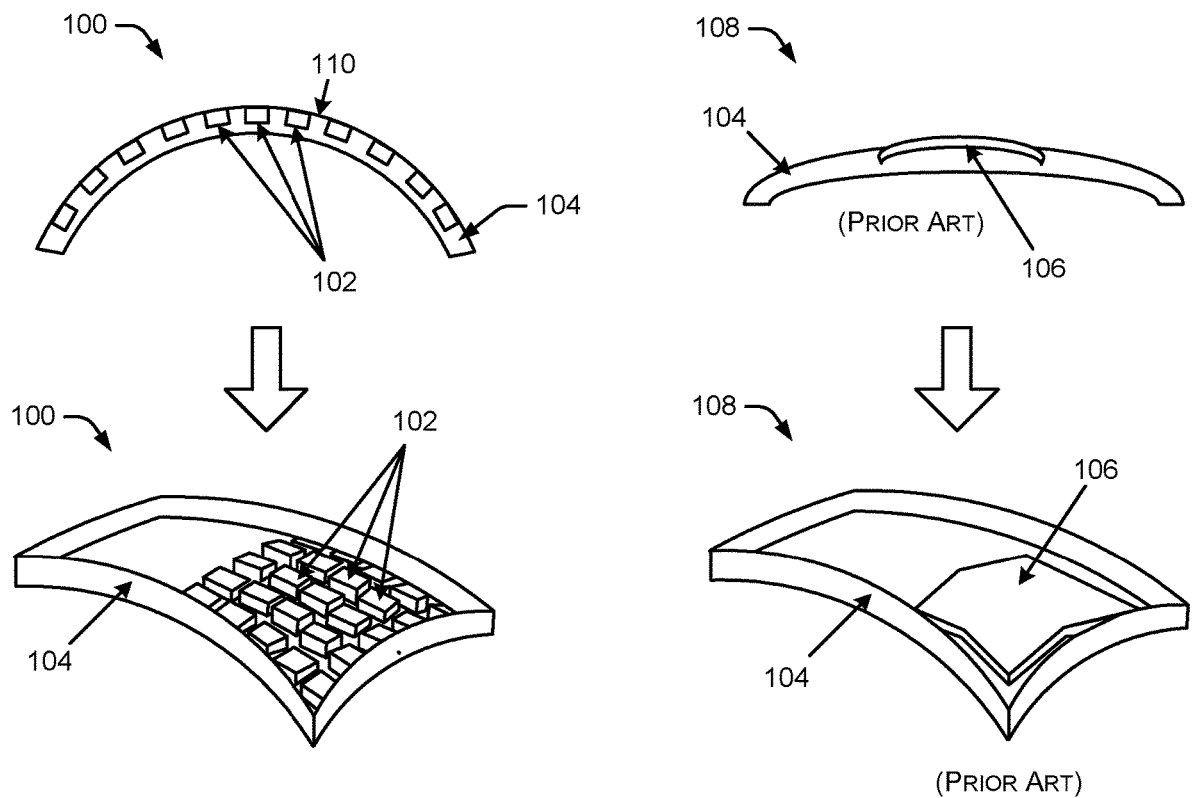
FIG. 1 is a diagram of an example microelectronics package in which many relatively small dielets are attached to a flexible substrate for a low stress package.

FIG. 1 shows a microelectronics package 100 in which many relatively small dielets 102 are attached to a flexible substrate 104, such as a flexible organic substrate, for a low stress package that has flexibility and shock-resistance. The dielets 102 may be attached to the flexible substrate 104 in a wafer-level reconstitution process, for example.

In contrast, attachment of conventional large dies 106 to a flexible substrate 104, even when the conventional large dies 106 are thinned, results in a higher-stress package 108 that has limited flexibility.

In an implementation, the dielets 102 in a flexible microelectronics package 100 may be small, single crystalline dielets 102 embedded in, or mounted on, the flexible substrate 104 and arrayed in a fan-out-wafer-level package (FOWLP), for example, for high integration with a relatively high number of external contacts. The FOWLP layout can yield a small package footprint with high input/output (I/O) capacity and improved thermal performance because the dielets 102 shed heat more efficiently than large chips, and can yield improved electrical performance depending on the fan-out design. In an implementation, high-density interconnections 110 between the dielets 102 are implemented by a direct hybrid bonding process to achieve a sufficient number of lines along the limited beachfront of each dielet 102 to achieve significant computing power among the array of dielets 102 on the flexible substrate 104.

Figure 2:
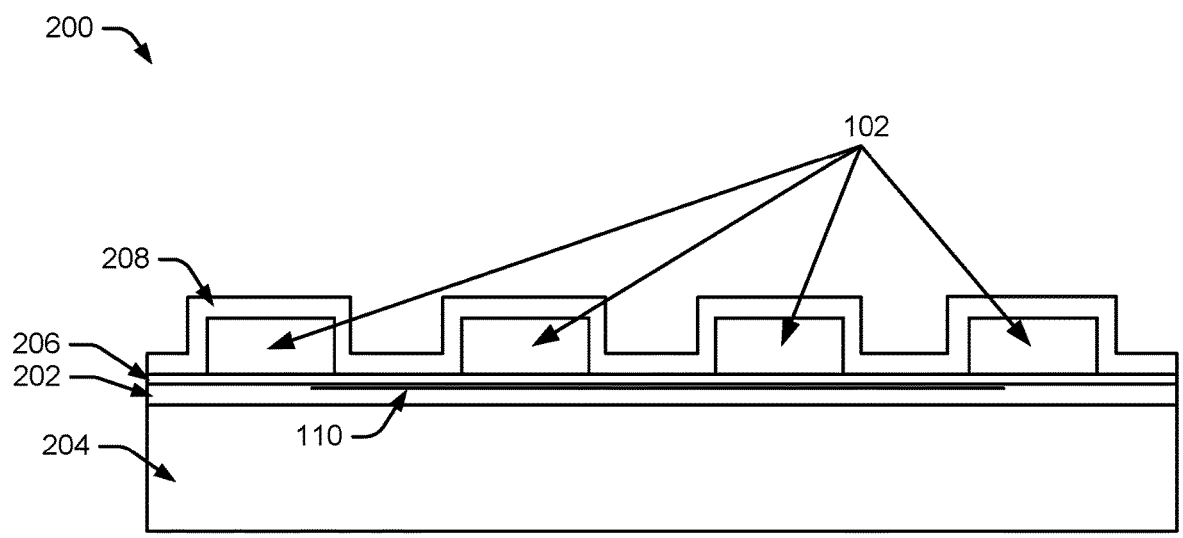
FIG. 2 is a diagram of an example microelectronics package fabricated in an example reconstitution process.
Figure 2:
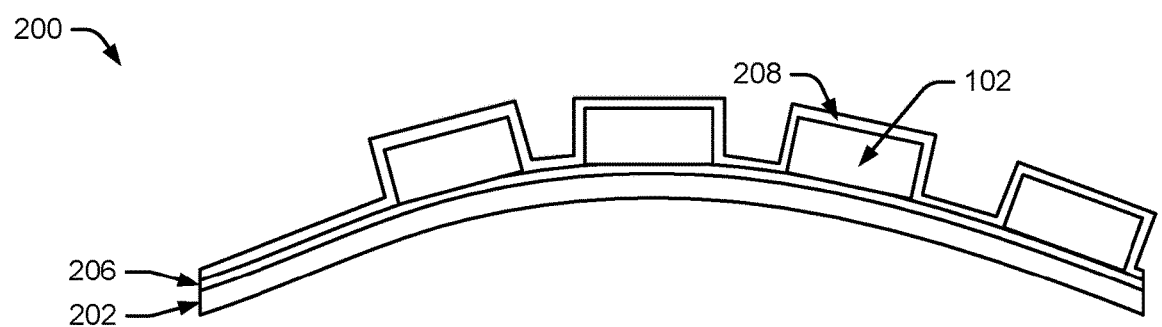

FIG. 2 shows an example microelectronics package 200 fabricated in an example reconstitution process. A flexible routing layer 202 with high-density interconnects 110 is applied to, or built upon, a carrier 204, such as a pad or wafer of silicon or glass, or onto a substrate made of another material. An optional oxide layer 206 (layers not shown to relative scale) may be added onto the flexible routing layer 202 when the direct-bonding process forms oxide bonds, such as oxide-oxide bonds, or metal-oxide bonds. The dielets 102 are attached to the flexible routing layer 202 including, for example, the step of direct-bonding conductive I/O contact pads of the dielets 102 to high-density conductive lines 110 in the flexible routing layer 202. An optional conformal coating 208 may be applied over and between the dielets 102. The carrier 204 is then removed, leaving the dielets 102 electrically interconnected and attached to the flexible routing layer 202. If the flexible routing layer 202 is durable enough for the given microelectronics application, then the conformal coating 208 on top of the dielets 102 may be omitted.

Figure 3:
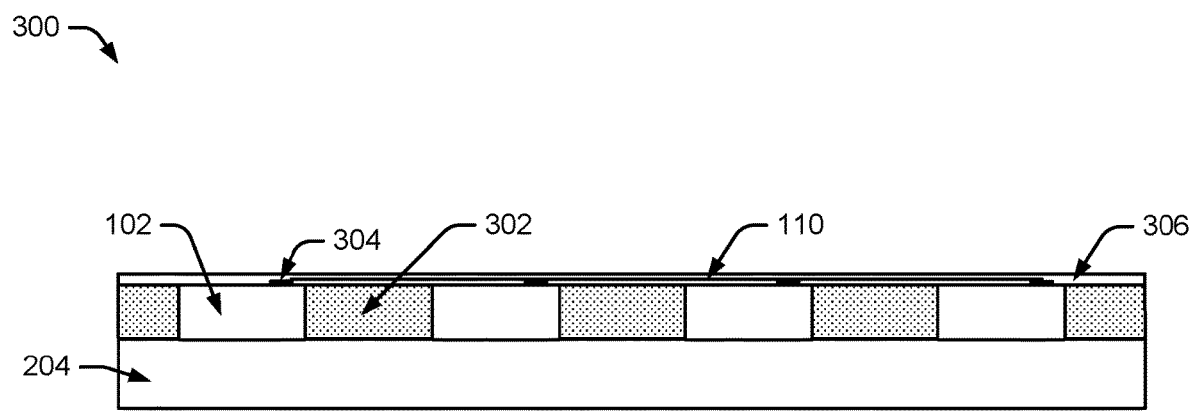
FIG. 3 is a diagram of another example microelectronics package fabricated in another example reconstitution process.
Figure 3:
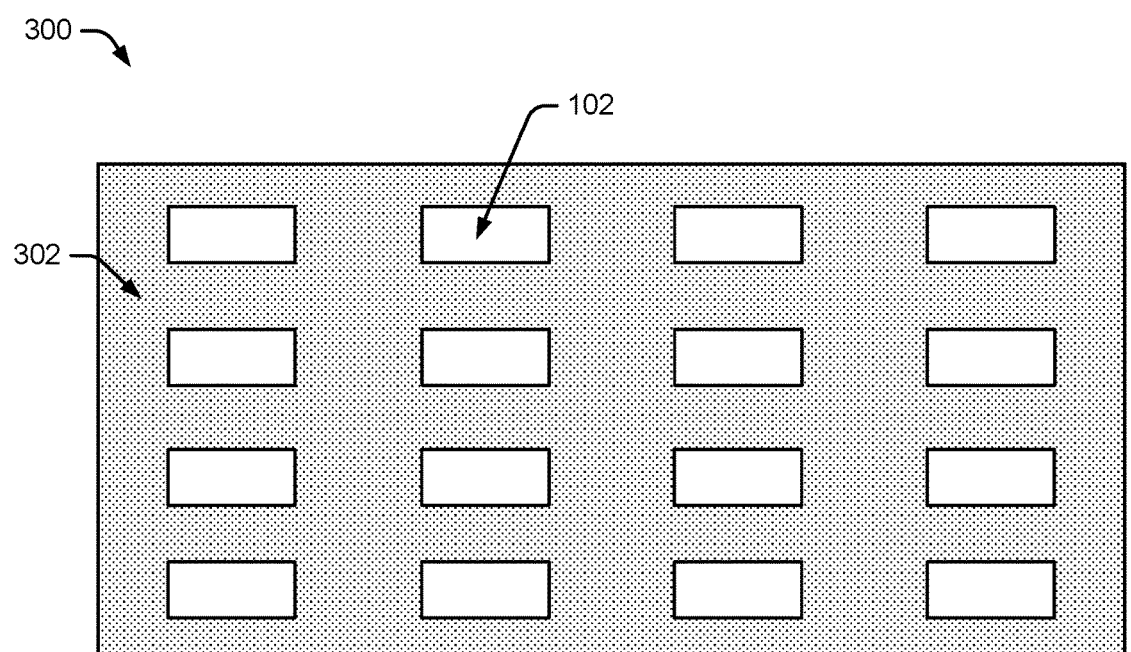

FIG. 3 shows another example microelectronics package 300 fabricated in another example reconstitution process. The dielets 102 are mounted face-up on a carrier 204, covered and interspersed with a molding material 302, and planarized to expose conductive contacts 304. Then a redistribution layer (RDL) 306 or thin-film process creates inter-dielet interconnects 110, applying a direct-bonding process. For example, in an implementation, the dielets 102 can be front-end prefabricated, and attached face-up to the pad or artificial wafer 204. After attachment of the dielets 102, a molding process may inject a molding compound 302 at least around the dielets 102 to form a compound die-carrier, which becomes an artificial reconstituted wafer. Gaps and edges around the dielets 102 are filled with the casting compound 302 to form the artificial wafer. After curing through thermal processing, the artificial wafer includes a mold frame 302 around the dies for carrying the additional interconnect elements 110. After the build, the electrical connections from the dielet pads 304 to interconnects 110 can be made in thin-film technology, for example, as they are for other conventional Wafer Level Packages (WLPs). The flexible microelectronics packages 100 & 200 & 300 may also be fabricated in many other ways besides example reconstitution processes.

Metal-metal direct-bonding of conductive lines to the dielets 102 may be accomplished with fine pitch interconnection techniques, such as direct bond interconnect (DBI®), a hybrid technology that directly bonds conductive metal bond pads on each side of an interface together, and also bonds respective dielectrics together on each side of the interface. The direct bonding or direct hybrid bonding processes can electrically connect the dielets 102 together via the conductive lines, even when the dielets 102 have different process node parameters (Ziptronix, Inc., an Xperi Corporation company, San Jose, Calif.). DBI® hybrid bonding is currently available for fine-pitch bonding in 3D and 2.5D integrated circuit assemblies to bond the dielets 102 to interconnect lines 110 between the dielets 102. See for example, U.S. Pat. No. 7,485,968, which is incorporated by reference herein in its entirety.

DBI® hybrid bonding technology, for example, has been demonstrated at an interconnect pitch of 2 um. DBI® bonding technology has also been demonstrated down to a 1.6 um pitch in wafer-to-wafer approaches that do not have an individual die pitch limitation, with pick-and-place (P&P) operations (Pick & Place surface-mount technology machines). Using DBI® technology, a DBI® metallization layer replaces under bump metallization (UBM), underfill, and micro-bumps. Bonding at dielet level is initiated at room temperature and may be followed by a batch anneal at low temperature. ZiBond® direct bonding may concomitantly be used in some circumstances (Ziptronix, Inc., an Xperi Corporation company, San Jose, Calif.).

The flexible routing layer 202 may be created in numerous ways. Although other materials can be employed for the flexible and stretchable microelectronics described herein, with high-density interconnections between dielets 102, plastic materials are a preferred substrate due to their low cost and the inherent high degree of flexibility, bendability, and stretchability of select plastics. Plastic materials also provide some attractive chemical and mechanical properties. Clear plastics can be used for optical applications where transparency is an advantage or requirement.

Flexible electronics on plastic substrates may lower the cost of production, using roll-to-roll (R2R) and other manufacturing processes, for example. Polymers that can be used as flexible substrates or flexible routing layers 202 include polyethylene terephthalate (PET), heat stabilized PET, polyetheretherketone (PEEK), polyethylene napthalate (PEN), and heat stabilized PEN, for example. Other polymer substrates include polycarbonate (PC) and polyethersulphone (PES), which are thermoplastics that can be melt-extruded or solvent-casted. Some polymers that cannot be melt-processed include modified polycarbonate (PC), polyarylate (PAR), polyethersulphone (PES), polycyclic olefin (PCO), polynorbonene (PNB), and polyimide (PI).

Polymer substrates with glass transition temperatures higher than 140° C. (for example, heat stabilized PEN and PET) have high melting points, which allows these polymers to be melt processed without degradation. Most polymers can be made transparent, for optical clarity.

The coefficient of thermal expansion (CTE) of a flexible substrate or flexible routing layer 202 is an important issued in making example flexible microelectronic devices. When there is a difference in CTEs between the flexible substrate and layers built or deposited on the flexible substrate, the built or deposited layers may strain and crack under thermal cycling. A flexible material with a low CTE (for example, less than 20 ppm/° C.) is desirable to match the thermal expansion of the substrate to the subsequent layers which may be deposited on top of the flexible layer.

Figure 4:
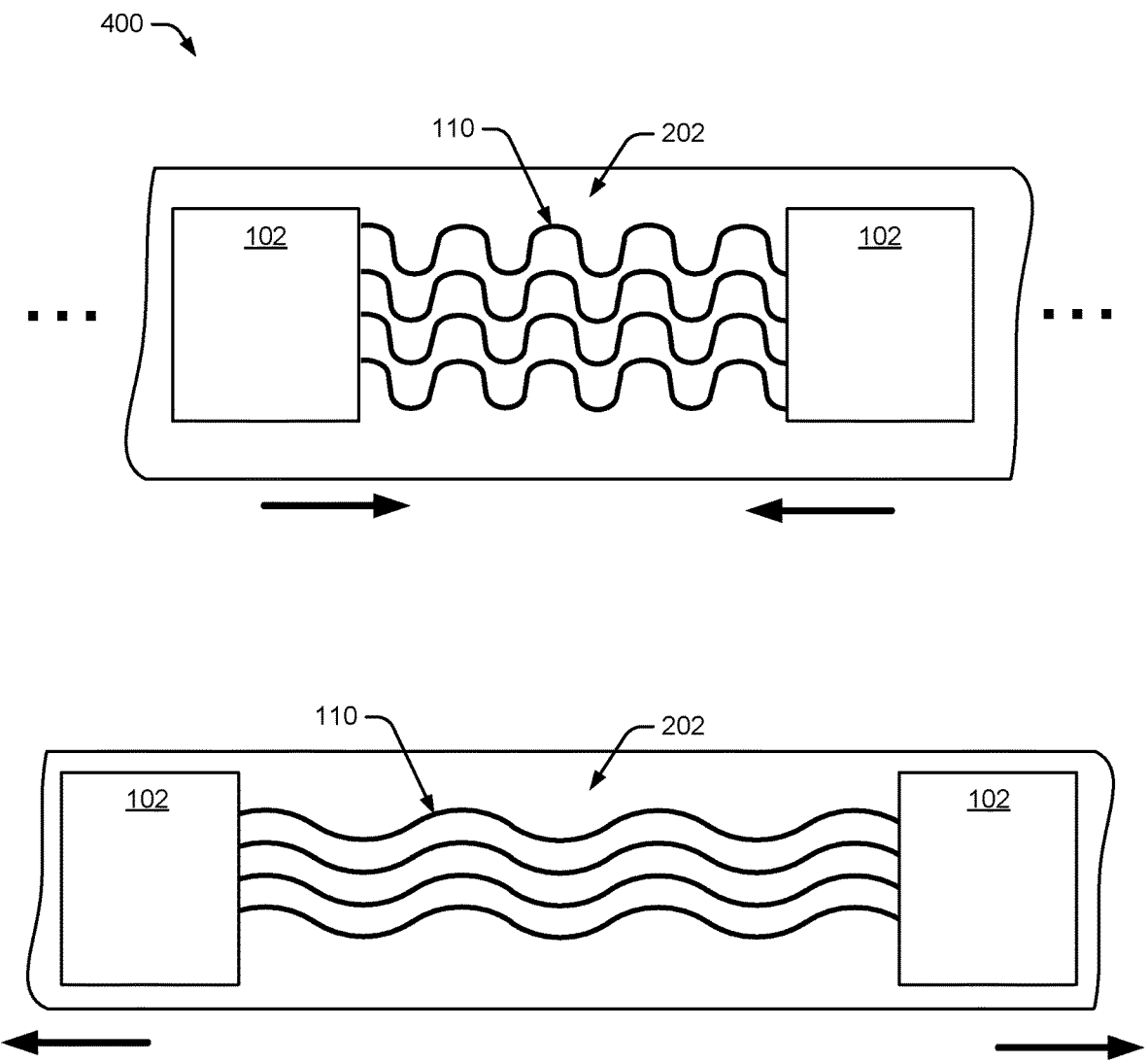
FIG. 4 is a diagram of a section of an example microelectronics device in which dielets are attached to a flexible, stretchable, and/or twistable routing layer that includes compliant high-density interconnect lines.

FIG. 4 shows a section of an example microelectronics device 400 in which dielets 102 are attached to a flexible, stretchable, and/or twistable routing layer 202 that includes compliant high-density interconnect lines 110. When the flexible substrate material of the flexible routing layer 202 is bent, flexed, stretched, or twisted, the material and/or geometry of the high-density interconnect lines 110 enables the interconnect lines 110 to bend, flex, stretch, or twist with the flexible substrate material.

Figure 5:
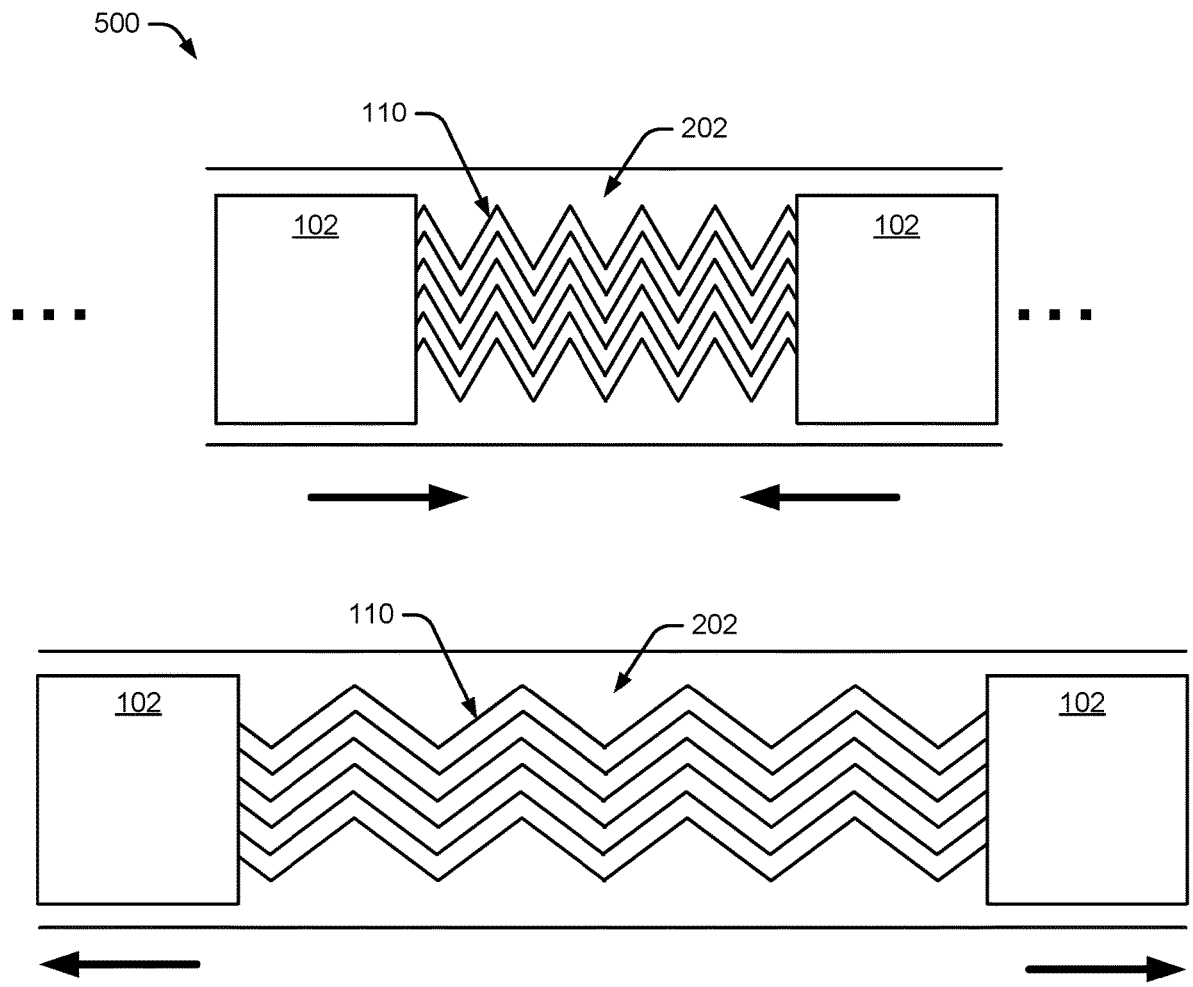
FIG. 5 is a diagram of another example microelectronics device in which dielets are attached to a flexible, stretchable, and/or twistable routing layer that includes a different configuration of compliant high-density interconnect lines than shown in FIG. 4.

FIG. 5 shows a section of another example microelectronics device 500 in which dielets 102 are attached to a flexible, stretchable, and/or twistable routing layer 202 that includes a different configuration of compliant high-density interconnect lines 110 than shown in FIG. 4. When the flexible substrate material of the flexible routing layer 202 is bent, flexed, stretched, or twisted, the material and/or geometry of the high-density interconnect lines 110 enables the interconnect lines 110 to bend, flex, stretch, or twist with the flexible substrate material.

Figure 6:
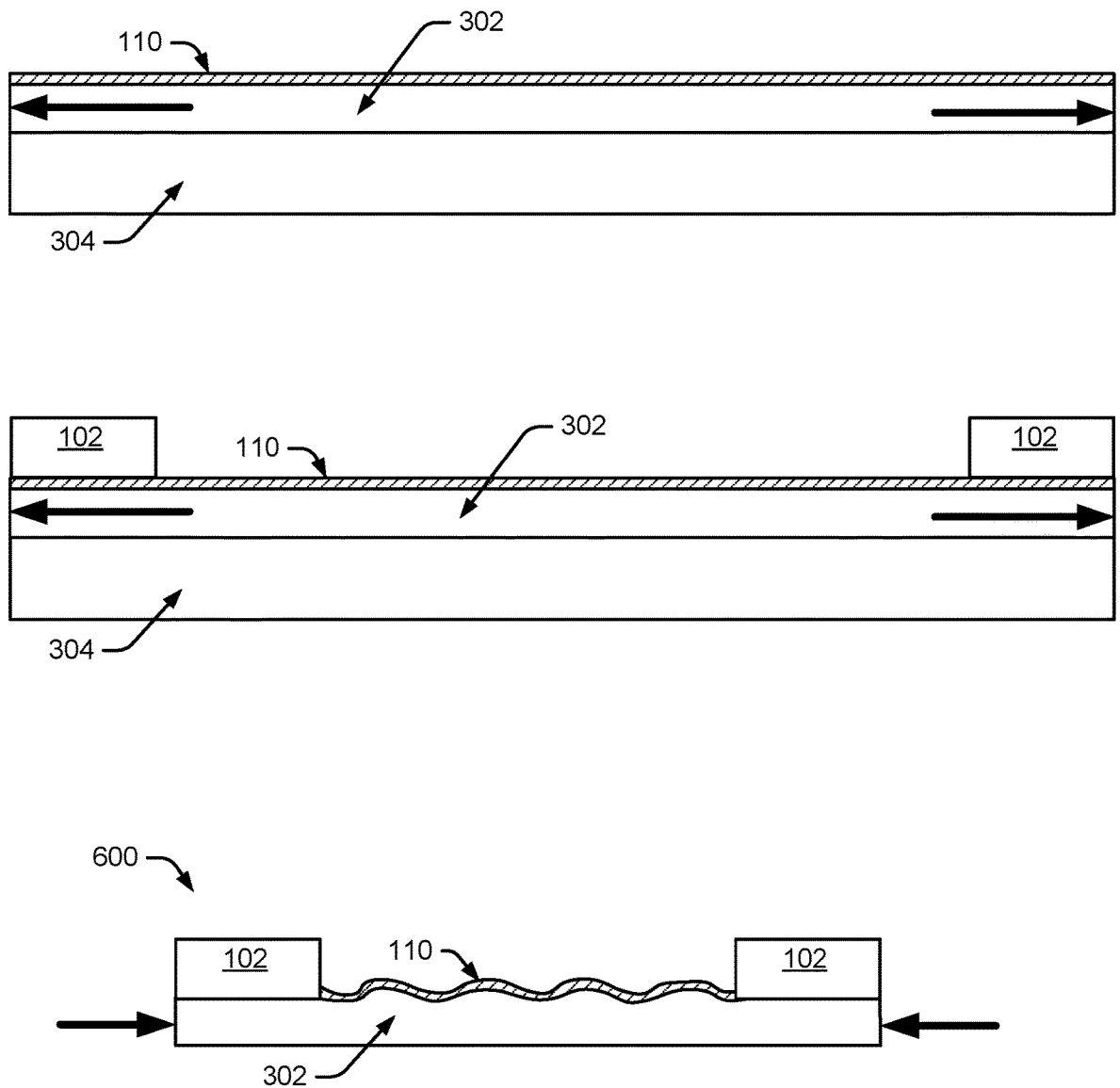
FIG. 6 is a diagram of an example manufacturing process for making a flexible and stretchable microelectronics package.

FIG. 6 shows an example manufacturing process for making a flexible and stretchable microelectronics package 600. A flexible substrate 302 is stretched over a hard surface, such as a wafer, platform, or mandrel 204. Conductive interconnect lines 110 at fine pitch are deposited, printed, or formed on the stretched surface of the stretched flexible substrate 302. Next, dielets 102 are attached to the flexible substrate 302, and electrically connected to the conductive interconnect lines 110 through a direct bonding or hybrid bonding technique, such as DBI® hybrid bonding. The flexible substrate 302 with conductive interconnect lines 110 is removed from the wafer, platform, or mandrel 204 and allowed to relax, relieving the stretch in while contracting. The conductive interconnect lines 110 fold or otherwise find a geometry to compact themselves when the flexible substrate 302 contracts. The flexible and stretchable microelectronics package 600 can be flexed and stretched in the future, to at least the point of stretch present in the flexible substrate 302 during manufacture.

Figure 7:
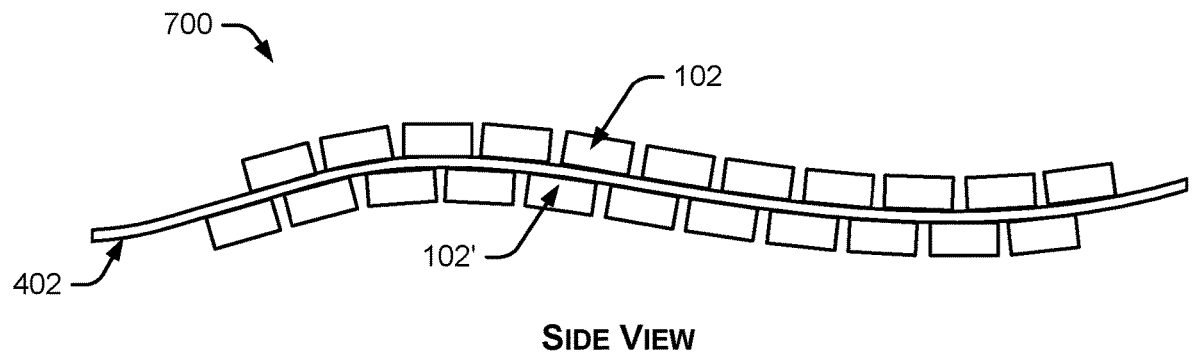
FIG. 7 is a diagram of an example flexible microelectronic band or strip with dielets attached on both sides of a flexible substrate or membrane.
Figure 7:
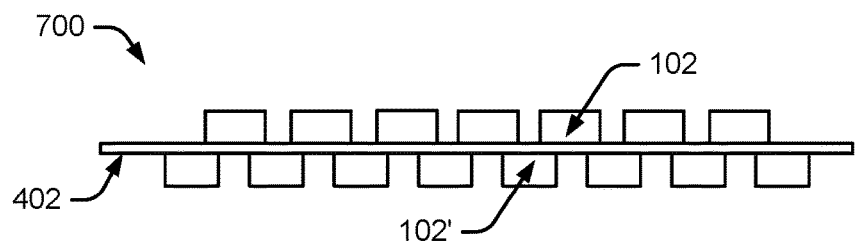

FIG. 7 shows an example flexible microelectronic band or strip 700 with dielets 102 attached on both sides of a flexible substrate 302 or membrane. The band or strip 700 may be used for wearable electronics, or may be used as a module or "card" in vibration-prone or shock-prone environments.

The dielets 102 may be in communication with each other on each side, and may be in communication with each other across the flexible substrate 302 or membrane, through conductive vias across the flexible substrate 302 or membrane. The flexible substrate 302 or membrane may be relatively thick, or may be extremely thin, depending on the polymer or other material used, for example down to 2 microns thick. The dielets 102 may also be relatively small, down to 2 microns on an edge. The dielets 102 may communicate with each other via standard I/O interfaces on some or all of the dielets 102. Some dielets 102 may communicate with other dielets 102' across the flexible substrate 302 or membrane via their core-side conductors, direct-bonded or hybrid bonded directly to the core-side conductors of the dielets 102' across the flexible substrate 302 or membrane, with no intervening standard I/O interfaces on the dielets 102 & 102'.

When the example flexible microelectronic device 700 uses dielets 102 that have core-side conductors direct-bonded to one or more other dielets 102', thereby providing "native interconnects," the native interconnects can be the only interface between the connected dielets 102 & 102'. The native interconnects can enable electronic circuits to span across many different dielets 102 & 102' and across the dielet boundaries without the overhead of standard interfaces, including no input/output protocols at the cross-die boundaries traversed by the direct-bonded connections to the native core-side conductors of the dielets 102 & 102'.

Standard interfaces mean "additional hardware, software, routing, logic, connections, or surface area added to the core logic real estate or functionality of a dielet 102 or 102' in order to meet an industry or consortium specifications for interfacing, connecting, or communicating with other components or signals outside the dielet 102.

The direct-bonding, such as DBI® hybrid bonding, that enables native interconnects to be used at very fine pitch between dielets 102 & 102', means direct-contact metal-to-metal bonding, oxide bonding, or fusion bonding between two metals, such as copper to copper (Cu—Cu) metallic bonding between two copper conductors in direct contact, with at least partial copper metallic crystal lattice cohesion. Such direct-bonding may be provided by room-temperature DBI® (direct bond interconnect) hybrid bonding technology or other direct bonding techniques (Ziptronix, Inc., an Xperi Corporation company, San Jose, Calif.). "Core" and "core-side" mean at the location, signal, and/or level present at the functional logic of a particular dielet 102, as opposed to at the location, signal, and/or level of an added standard interface defined by a consortium. Thus, a signal is raw or "native" if it is operational at the core functional logic level of a particular die, without certain modifications, such as additional serialization, added ESD protection except as inherently provided by the particular circuit; has an unserialized data path, can be coupled across dies by a simple latch, flop, or wire, has no imposed input/output (I/O) protocols, and so forth. A native signal, however, can undergo level shifting, or voltage regulation for purposes of adaptation between dies of heterogeneous foundry origin, and still be a native signal, as used herein. Thus, a native conductor of a dielet 102 or 102' is an electrical conductor that has electrical access to the raw or native signal of the dielet 102, as described above, the native signal being a signal that is operational at the level of the core functional logic of a particular die, without appreciable modification of the signal for purposes of interfacing with other dielets 102 or 102'.

The native interconnects for conducting such native signals from the core-side of a dielet 102 can provide continuous circuits disposed through two or more cross-die boundaries and through the flexible substrate 402 of the particular flexible microelectronic device 700 without amplifying or modifying the native signals, except as desired to accommodate dielets 102 from different manufacturing processes. From a signal standpoint, the native signal of the IP core of one dielet 102 is passed directly to other dielets 102' via the directly bonded native interconnects, with no modification of the native signal or negligible modification of the native signal, thereby forgoing standard interfacing and consortium-imposed input/output protocols.

Such uninterrupted circuits that proceed across dielet boundaries with no interfacing and no input/output protocols can be accomplished using native interconnects fabricated between different dielets 102 from heterogeneous foundry nodes or dielets 102 with incompatible manufacturing. Hence, an example circuit may proceed across the dielet boundary between a first dielet 102 manufactured at a first foundry node that is direct-bonded to a second dielet 102' manufactured at a second foundry node, with no other interfacing, or with as little as merely latching or level shifting, for example, to equalize voltages between dielets 102 & 102'. In an implementation, the circuits disposed between multiple dies through direct-bonded native interconnects may proceed between custom dielets 102 on each side of a wafer-to-wafer (W2W) process that creates direct-bonds, wherein at least some of the W2W direct bonding involves the native conductors of dielets 102 on at least one side of the W2W bonds.

In an implementation, a flexible microelectronic device 700 utilizing semiconductor dielets 102 can reproduce various architectures, such as ASIC, ASSP, and FPGA, in a smaller, faster, and more power-efficient manner, as each dielet 102, as introduced above, is a complete subsystem IP core (intellectual property core), for example, a reusable unit of logic on a single chiplet or die piece.

Figure 8:
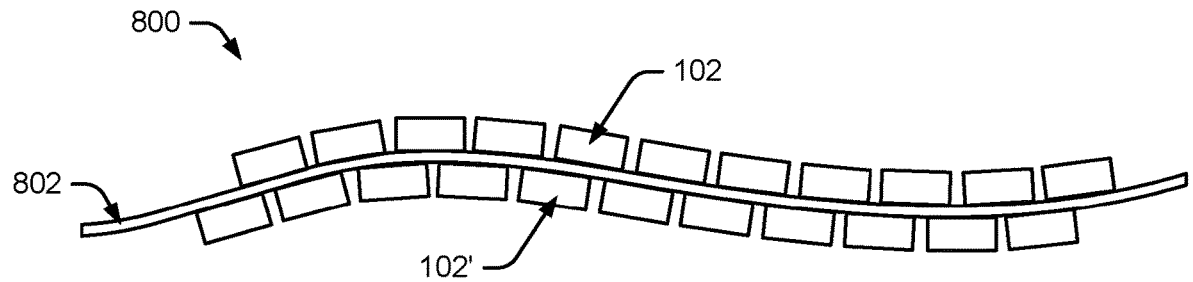
FIG. 8 is a diagram of an example flexible and/or stretchable microelectronic string or filament device with dielets attached on both sides of a flexible and/or stretchable filament substrate.
Figure 8:
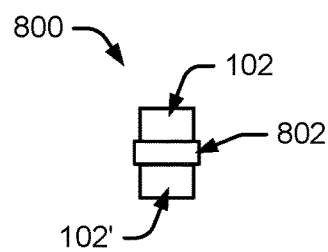
Figure 8:
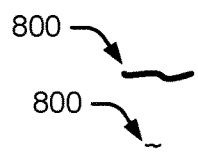

FIG. 8 shows an example flexible and/or stretchable microelectronic string or filament device 800 with dielets 102 attached on both sides of a flexible and/or stretchable filament substrate 802. The flexible filament device 800 may have dielets 102 attached across a very narrow width 804, for example a few microns across, with very small dielets 102 of the order of only microns on an edge. The flexible filament device 800 may have the dielets 102 attached in single file, as shown, on one or both sides of the flexible filament substrate 802. Such a flexible filament device 800 can be used to bring relatively complex microelectronics or high computing power to small sensors, wearable appliances, artificial hair, braces, implantable medical devices, catheters for dwelling inside blood vessels or other parts of a human or animal body, and so forth. The dielets 102 on a single side of the flexible filament device 800 may be communicatively coupled with each other via a high count of conductive lines direct-bonded to bonding pads of the dielets 102 for high-density communication between dielets 102. Dielets 102 & 102' on opposing sides of the flexible filament substrate 802 may be coupled with each other across the material of the flexible filament substrate 802 by direct-bonding or direct hybrid bonding between standard I/O interfaces of the dielets 102 & 102', or by direct-bonding or direct hybrid bonding between core-level native interconnects of the dielets 102 & 102', as described above.

Example Methods

Figure 9:
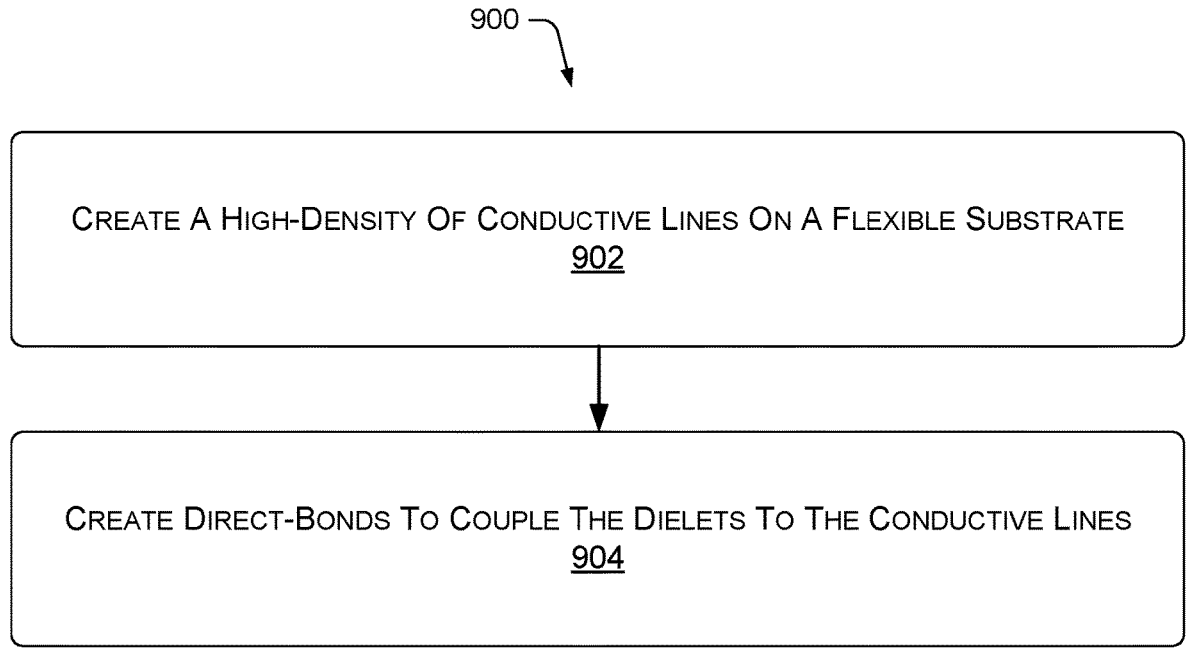
FIG. 9 is a flow diagram of an example method of making a flexible microelectronics package with direct-bonding techniques applied to dielets.

FIG. 9 shows an example method 900 of making a flexible microelectronic device with dielets that are direct-bonded to high-density interconnects. Operations of the example method 900 are shown in individual blocks.

At block 902, high-density conductive lines are created on a flexible substrate.

At block 904, direct-bonds are created to couple dielets to the high-density conductive lines. The dielets interconnected by high-density conductive lines can emulate the computing power of large monolithic chips with ample memory on a flexible, stretchable, or twistable substrates.

The flexible substrate may be made of polyethylene terephthalate (PET), heat stabilized PET, polyetheretherketone (PEEK), polyethylene napthalate (PEN), heat stabilized PEN, polycarbonate (PC), polyethersulphone (PES), polyarylate (PAR), polycyclic olefin (PCO), polynorbonene (PNB), or polyimide (PI), for example.

The method 900 may include coupling the dielets to the conductive lines at a pitch of approximately 3 microns. In some cases, the dielets may have footprint dimensions in a range of approximately 0.25×0.25 microns to approximately 5.0×5.0 microns, in which case the conductive lines and the direct-bonds are at a pitch of less than 3 microns, in relation to the size of the dielets used.

The method 900 may include coupling the dielets to the conductive lines through standard I/O interfaces onboard the dielets. Or, the method 900 may include coupling the dielets to the conductive lines through native core-level interconnects of the dielets at a pitch of 3 microns or less. In some cases the native interconnects may connect dielets through a thickness of the flexible substrate, and the dielets may be on both sides of the flexible substrate.

The method 900 may include extending a circuit of a first dielet across a die boundary between the first dielet and a second dielet via the native core-level interconnects between the first dielet and the second dielet, the circuit spanning across the native core-level interconnects, and passing the a native signal between a core of the first dielet and at least a functional block of the second dielet via the native core-level interconnects through the circuit spanning across the native core-level interconnects.

When native interconnects of the dielets are used instead of standard I/O interfaces of dielets, then a native core-side conductor of a first dielet may be direct-bonded to a core-level conductor of a second dielet to make a native interconnect between the first die and the second die. A circuit of the first dielet is extended via the native interconnect across a die boundary between the first dielet and the second dielet, spanning the native interconnect. A native signal of an IP core of the first dielet is passed between the core of the first dielet and at least a functional block of the second dielet through the circuit spanning across the native interconnect.

The native interconnects provided by the example method 900 may provide the only interface between a first dielet and a second dielet, while the native interconnects forgo standard interface geometries and input/output protocols. In an implementation, the first dielet may be fabricated by a first manufacturing process node and the second dielet is fabricated by a different second manufacturing process node. The circuit spanning across the native interconnect forgoes interface protocols and input/output protocols between the first dielet and the second dielet when passing the native signal across the native interconnect.

The example method 900 may further include direct-bonding native core-side conductors of multiple dielets across multiple dielet boundaries of the multiple dielets to make multiple native interconnects, and spanning the circuit across the multiple dielet boundaries through the multiple native interconnects. The multiple native interconnects providing interfaces between the multiple dielets, and the interfaces forgo interface protocols and input/output protocols between the multiple dielets.

The example method 9000 may pass the native signal between a functional block of the first dielet and one or more functional blocks of one or more other dielets of the multiple dielets through one or more of the native interconnects while forgoing the interface protocols and input/output protocols between the multiple dielets. The native signal may be passed unmodified between the core of the first dielet and the at least one functional block of the second dielet through the circuit spanning across the native interconnect.

The native signal may be level shifted between the core of the first dielet and the at least one functional block of the second dielet through the circuit spanning across the native interconnect, the level shifting to accommodate a difference in operating voltages between the first dielet and the second dielet.

The example method 900 may be implemented in a wafer-to-wafer (W2W) bonding process, for example, wherein the first dielet is on a first wafer and the second dielet is on a second wafer, and wherein the W2W bonding process comprises direct-bonding native core-side conductors of the first dielet with conductors of the second dielet to make native interconnects between the first dielet and the second dielet, the native interconnects extending one or more circuits across a dielet boundary between the first dielet and the second dielet, the one or more circuits spanning across the one or more native interconnects, the native interconnects providing an interface between respective dielets, the interface forgoing interface protocols and input/output protocols between the respective dielets. The first wafer and the second wafer may be fabricated from heterogeneous foundry nodes or the first dielet and the second dielet are fabricated from incompatible manufacturing processes. In an implementation, the example method 900 may direct-bond the native core-side conductors between some parts of the first wafer and the second wafer to make the native interconnects for passing the native signals, but create other interfaces or standard interfaces on other parts of the wafer for passing amplified signals in a microelectronic device resulting from the W2W process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A microelectronics device, comprising:
a flexible substrate comprising at least one of a plastic or a polymer;
an oxide layer added to the flexible substrate;
conductive lines secured to the flexible substrate; and
dielets direct-bonded to the flexible substrate with direct-bonds such that (i) the dielets are physically coupled to the oxide layer and (ii) the dielets are electrically coupled to the conductive lines via metal to metal direct-bonding without an intermediate via such that the dielets are electrically coupled together via the conductive lines.

2. The microelectronics device of claim 1, wherein the conductive lines comprise high-density flexible conductive traces at a fine pitch or an ultrafine pitch; and
wherein a physical connection to the flexible substrate and electrical connections between each dielet and the fine pitch or ultrafine pitch high-density flexible conductive lines are accomplished with the direct-bonds at the fine pitch or the ultrafine pitch.

3. The microelectronics device of claim 2, wherein the direct-bonds comprise oxide-to-oxide contact bonds and metal-to-metal contact bonds at the fine pitch or the ultrafine pitch.

4. The microelectronics device of claim 1, wherein the flexible substrate is stretchable or twistable and the conductive lines comprise a flexible, stretchable, and twistable routing layer.

5. The microelectronics device of claim 1, wherein the conductive lines and the direct-bonds are at a pitch of approximately 5 microns.

6. The microelectronics device of claim 1, wherein the dielets have footprint dimensions in a range of approximately 0.25×0.25 millimeters to approximately 5.0×5.0 millimeters.

7. The microelectronics device of claim 1, wherein the conductive lines and the direct-bonds are at a pitch of less than 3 microns.

8. The microelectronics device of claim 1, wherein the dielets are coupled to the conductive lines through standard I/O interfaces onboard the dielets.

9. The microelectronics device of claim 1, wherein a material of the flexible substrate is selected from the group consisting of polyethylene terephthalate (PET), heat stabilized PET, polyetheretherketone (PEEK), polyethylene napthalate (PEN), heat stabilized PEN, polycarbonate (PC), polyethersulphone (PES), polyarylate (PAR), polycyclic olefin (PCO), polynorbonene (PNB), and polyimide (PI).

* * * * *